United States Patent
Chou et al.

(10) Patent No.: US 9,250,295 B2
(45) Date of Patent: Feb. 2, 2016

(54) HIGH-VOLTAGE BATTERY CHARGING SIMULATION SYSTEM AND OPERATING METHOD THEREOF

(75) Inventors: Shean-Kwang Chou, New Taipei (TW); Hung-Hsi Lin, New Taipei (TW); Chih-Hung Lin, New Taipei (TW); Sheng-Hua Chen, New Taipei (TW)

(73) Assignee: SHIP AND OCEAN INDUSTRIES R&D CENTER, New Taipei (TW)

( * ) Notice: Subject to any disclaimer, the term of this patent is extended or adjusted under 35 U.S.C. 154(b) by 763 days.

(21) Appl. No.: 13/553,811

(22) Filed: Jul. 19, 2012

(65) Prior Publication Data
US 2013/0271065 A1    Oct. 17, 2013

(30) Foreign Application Priority Data

Apr. 11, 2012   (TW) .............................. 101112817 A

(51) Int. Cl.
*G06G 7/54*   (2006.01)
*G01R 31/36*  (2006.01)

(52) U.S. Cl.
CPC ............ *G01R 31/36* (2013.01); *G01R 31/3651* (2013.01)

(58) Field of Classification Search
CPC ............... G01R 31/36; G01R 31/3651; G01R 31/2848; H02J 7/0029
USPC ..................................................... 703/13, 18
See application file for complete search history.

(56) References Cited

U.S. PATENT DOCUMENTS

| | | | |
|---|---|---|---|
| 7,764,066 B2 | 7/2010 | Horning et al. | |
| 2012/0043935 A1* | 2/2012 | Dyer et al. | 320/109 |
| 2012/0112754 A1* | 5/2012 | Kawai | 324/428 |
| 2012/0119765 A1* | 5/2012 | Bracker et al. | 324/750.01 |

FOREIGN PATENT DOCUMENTS

TW   I262382 B   9/2006

OTHER PUBLICATIONS

Plett et al. "High-Performance Battery-Pack Power Estimation Using a Dynamic Cell Model"., 2004 IEEE. p. 1586-1593.*

* cited by examiner

*Primary Examiner* — Eunhee Kim
(74) *Attorney, Agent, or Firm* — Cheng-Ju Chiang

(57) ABSTRACT

The present invention relates to a high-voltage battery charging simulation system that includes a simulation high-voltage battery pack, a simulation battery management system, a multi-party communication device, and a charging station. The voltage of the simulation high-voltage battery pack can be calculated and updated immediately by the simulation battery management system to simulate the feature of real battery pack, so that it can detect the operation of the multi-party communication device and the charging station.

12 Claims, 2 Drawing Sheets

HIGH-VOLTAGE BATTERY CHARGING SIMULATION SYSTEM AND OPERATING METHOD THEREOF

BACKGROUND OF THE INVENTION

1. Field of the Invention

The invention relates in general to a battery charging simulation system, and more particularly to a high-voltage battery charging simulation system and an operating method thereof.

2. Description of the Related Art

It is well known that detecting processes can only be performed respectively for charging stations and communication devices. Thus, unpredictable errors may come out when the detecting processes are performed for the charging stations and multi-party communication devices in operation mode. During the detecting process, the charging stations and the communication devices have to be connected to battery packs. If the charging stations or the communication devices are in an unstable state, the battery pack may be damaged due to overheated or the battery pack may even cause explosion. Therefore, it is very important to use simulation devices to perform the detecting process.

In the disclosure of R.O.C Patent No. 1262382, the characteristics of the battery pack should be inputted to battery simulation devices. The battery simulation device then performs the simulation based on the characteristics of the battery pack. The aforementioned method not only wasted the time to input the characteristics, but also could not simulate changes of the battery pack when the battery pack was in a charging state. In other words, such simulation was not closed to real scenarios. As disclosure in U.S. Pat. No. 7,764,066, the voltage difference was utilized to simulate the conditions that the battery pack needed to be charged or the open circuit was damaged. The aforementioned method was not capable of simulating the changes of the battery pack when the battery pack was in the charging state. Therefore, such simulation was not closed to the scenario when the battery pack was in the charging state.

SUMMARY OF THE INVENTION

The present invention relates to a high-voltage battery charging simulation system that comprises a simulation high-voltage battery pack, a simulation battery management system, a multi-party communication device, and a charging station. A current voltage of the simulation high-voltage battery pack can be calculated and updated immediately by the simulation battery management system to simulate the characteristics of real battery packs, so that, in the real charging state, the efficiency of charging and communication from the multi-party communication device and the charging state can be detected.

The operating method of the high-voltage battery charging simulation system includes the following steps. The simulation battery management system configures the initial values of a current voltage and an open-circuit voltage, and then transmits the current voltage and a detected charging current to a multi-party communication device. The multi-party communication device translates the charging request, indicating the charging voltage and the charging current, to a language adopted by the charging station and then transmits the translated charging voltage and the translated charging current to the charging station. After confirming that the charging request in accordance with what the simulation high-voltage battery pack needs, the charging station transfers to a charging state. The simulation battery management system continuously calculates and updates the current voltage of the simulation high-voltage battery pack during the charging state. When the current voltage and the open-circuit voltage of the simulation high-voltage battery pack are equal to the charging voltage, the simulation high-voltage battery pack transfers from the charging state to a fully charged state.

The high-voltage battery charging simulation system and the operating method of the present invention are capable of simulating characteristic changes and operate process of the real battery back when it is in the charging state. By adopting the high-voltage battery charging simulation system on the detecting of the peripheral equipment like charging stations and the communication devices, the efficiency in the real charging process can be detected and maintained. This could avoid the real battery pack connecting to the peripheral equipment and prevent the error or instability from the internal parts of peripheral equipment resulting in overheat, damage or explosion. The safety of detecting can be raised and the loss of the cost can be diminished. In addition, the simulation battery management system can be an industrial or embedded apparatus with controlling and displaying functions. The charging conditions of the battery pack can be simulated by simple configuration so as to make the system more convenient.

DETAILED DESCRIPTION OF THE INVENTION

Figure 1:
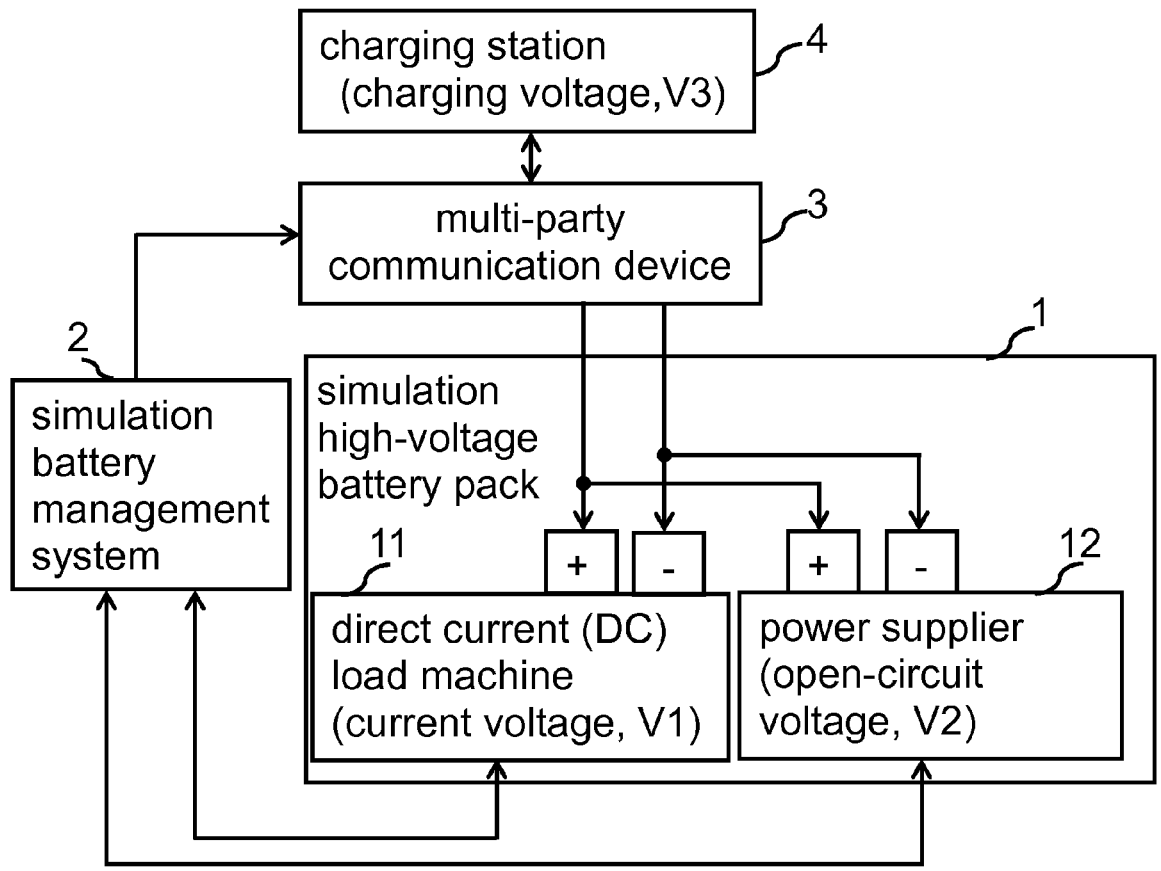
FIG. 1 is a block diagram of an embodiment of a high-voltage battery charging simulation system.

FIG. 1 is a block diagram of an embodiment of a high-voltage battery charging simulation system. The high-voltage battery charging simulation system comprises a simulation high-voltage battery pack 1, a simulation battery management system 2, a multi-party communication device 3, and a charging station 4. The simulation high-voltage battery pack 1 includes a direct current (DC) load machine 11 to simulate a current voltage (V1) of the simulation high-voltage battery pack 1 and a power supplier 12. In addition, the DC load machine 11 consumes a charging voltage (V3) outputted by the charging station 4 so as to simulate the power consumption of a real battery pack when the real battery pack is charged by the charging station 4.

The anode and the cathode of the power supplier 12 respectively connects to the anode and the cathode of the DC load machine 11 so as to simulate an open-circuit voltage (V2) of the simulation high-voltage battery pack 1. As such, the open-circuit voltage (V2) may be detected by the charging station 4 even if the charging station 4 is in a charging state. When the charging station 4 is in the charging state, the simulation battery management system 2 is capable of detecting the open-circuit voltage (V2) so as to simulate the scenario.

The simulation battery management system 2 can be an industrial or embedded computer with controlling and displaying functions. The simulation battery management system 2 connects to the DC load machine 11 and the power supplier 12 to calculate and updated the current voltage (V1) and the open-circuit voltage (V2). The calculation is performed based on charging characteristics of real battery packs and detected charging current so as to simulate changes of the real battery pack when the real battery pack is in the charging state. The calculation is performed by the equation below:

The Ah (Elective charge) of the simulation high-voltage battery pack 1 can be calculated by the equation below:

$$Ah(\text{Electric charge}) = \int I(t) \cdot dt$$

wherein I(t) indicates the charging current, and t means a time variable;

The SOC (State of charge) of the simulation high-voltage battery pack 1 is then calculated by the equation below:

$$SOC = (\text{Electric charge}(Ah)/\text{Battery capacity}(Ah)) *100\%;$$

The open-circuit voltage (V2) (Open-circuit voltage, OCV) of the simulation high-voltage battery pack 1 is in a function relationship with the SOC of the simulation high-voltage battery pack 1. The impedance value of the simulation high-voltage battery pack 1 is also in a function relationship with the SOC of the simulation high-voltage battery pack 1. Thus, the current voltage (V1) of the simulation high-voltage battery pack 1 is continuously calculated by the equation:

$$V1 = OCV(SOC) + I(t)*R(SOC);$$

The simulation battery management system 2, connecting to the multi-party communication device 3, calculates the current voltage (V1) and transmits the calculated current voltage (V1) and the detected charging current to the multi-party communication device 3 in a real time manner. The simulation battery management system 2 further determines if the multi-party communication device 3 is capable of adopting the charging voltage and the charging current as desired. If yes, the multi-party communication device 3 translates the charging voltage and the charging current to a language adopted by the charging station 4 and transmits the translated charging voltage and the translated charging current to the charging station 4 so that the charging station 4 is in the charging state.

The simulation battery management system 2 is capable of testing performance of charging station 4. The charging station 4 is supported by the DC fast-charging standards of CHAdeMO, Society of Automotive Engineers (SAE), International Electrotechnical Commission (IEC), or Guo Biao (GB) of China's National Standards. The charging station 4 connects to the multi-party communication device 3 by a plug. Upon receiving a charging request from the multi-party communication device 3, the charging station 4 determines whether the charging request is operable according to the state of the simulation high-voltage battery pack 1. For example, the open-circuit voltage (V2) confirms the state of current voltage (V1) is matched with the charging request and then the charging station 4 is in a charging state.

When the simulation high-voltage battery pack is in the charging state, the current voltage (V1) is configured to be larger than or equal to the open-circuit voltage (V2), and less than the charging voltage (V3) so as to prevent the DC load machine 11 from consuming the open-circuit voltage (V2) outputted by the power supplier 12. As such, The DC load machine 11 only consumes the charging voltage (V3) outputted by the charging station 4 in the charging state so as to simulate the real battery pack in charging state consumes the charging voltage (V3) outputted by the charging station 4. The simulation high-voltage battery pack transfers to a fully charged state when the current voltage (V1) and the open-circuit voltage (V2) are equal to the charging voltage (V3).

Figure 2:
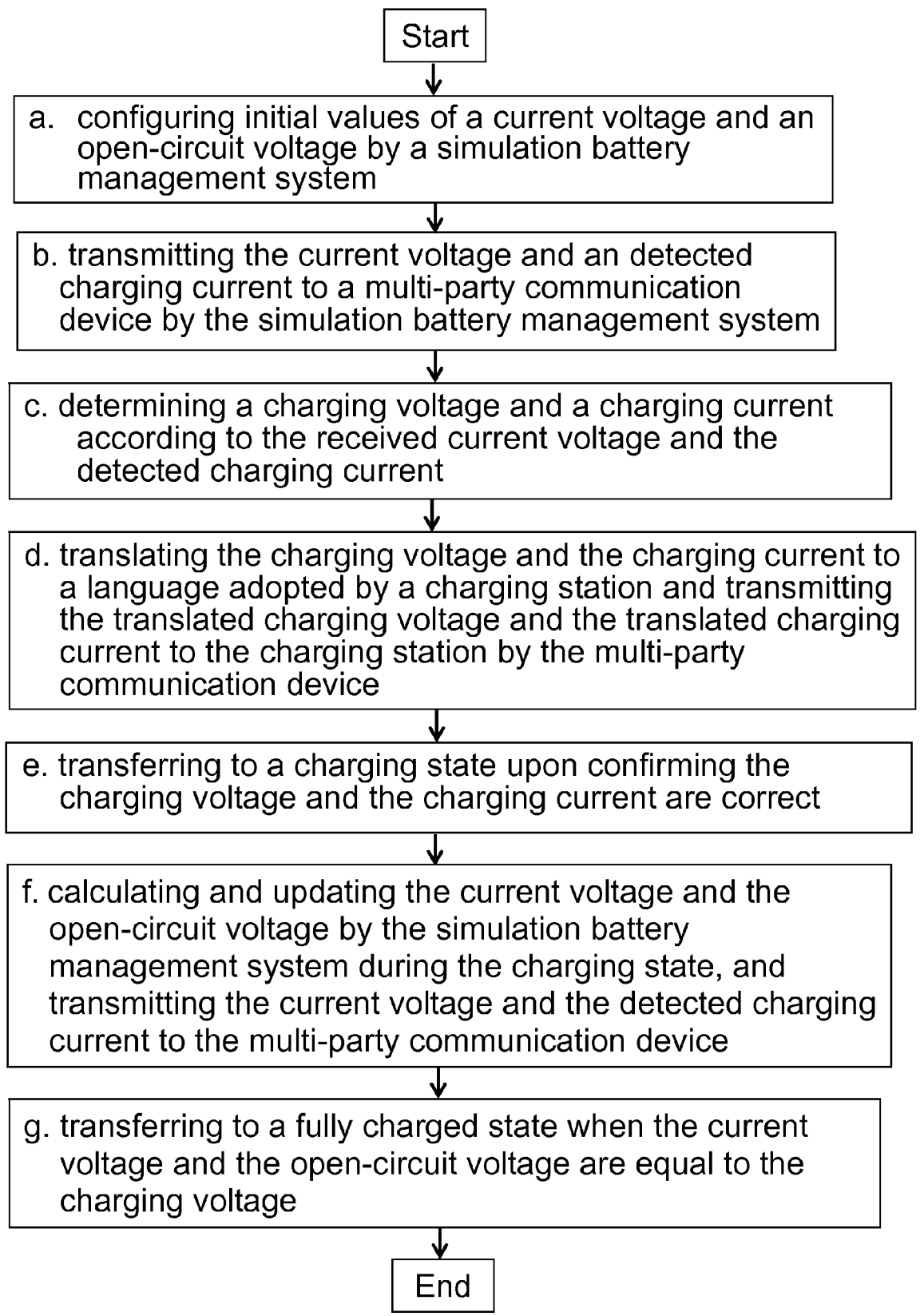
FIG. 2 is a flowchart of an embodiment of an operating method of a high-voltage battery charging simulation system.

FIG. 2 is an embodiment of the operating method of the present invention. The method comprises the following steps. The simulation battery management system 2 configures initial values of a current voltage (V1) and an open-circuit voltage (V2). The simulation battery management system 2 calculates and updates the current voltage (V1) and the open-circuit voltage (V2) according to a detected charging current in accordance with charging characteristics of real battery packs. The simulation battery management system 2 transmits the current voltage (V1) and the detected charging current to a multi-party communication device 3.

The multi-party communication device 3 determines a charging voltage (V3) and a charging current according to the received current voltage (V1) and the detected charging current, and then translates the charging voltage (V3) and the charging current to a language adopted by a charging station 4. The translated charging voltage and the translated charging current are transmitted to the charging station 4 by the multi-party communication device 3.

The charging station 4 is supported by the DC fast-charging standards of CHAdeMO, Society of Automotive Engineers (SAE), International Electrotechnical Commission (IEC), or Guo Biao (GB) of China's National Standards. The charging station 4 confirms the charging voltage (V3) and the charging current are correct. The charging station 4 confirms the charging request matches a state of the simulation high-voltage battery pack 1 via the multi-party communication device 3. After confirming that the current voltage (V1) is less than the charging voltage (V3) and larger than or equal to the open-circuit voltage (V2), the simulation high-voltage battery pack 1 transfers to a charging state.

The simulation battery management system 2 calculates and updates the current voltage (V1) and the open-circuit voltage (V2) when the simulation high-voltage battery pack 1 is in the charging state. The simulation battery management system 2 then transmits the current voltage (V1) and the detected charging current to the multi-party communication device 3. When the current voltage (V1) and the open-circuit voltage (V2) are equal to the charging voltage (V3), the simulation high-voltage battery pack 1 transfers to a fully charged state.

What is claimed is:

1. A high-voltage battery charging simulation system comprising:
   a simulation high-voltage battery pack comprising a direct current (DC) load machine and a power supplier;
   a simulation battery management system connecting to the DC load machine and the power supplier;
   a multi-party communication device connecting to the DC load machine, the power supplier and the simulation battery management system, the multi-party communication device configured to receive a charging voltage and a charging current required by the simulation high-voltage battery pack from the simulation battery management system; and
   a charging station connecting to the multi-party communication device, the charging station configured to supply the charging voltage and the charging current to the simulation high-voltage battery pack;
   wherein the simulation battery management system is configured to configure initial values of a current voltage and an open-circuit voltage, and transmit the current voltage and the charging current to the multi-party communication device;
   wherein the current voltage is calculated by the following equation:

$$\text{current voltage} = OCV(SOC) + I(t)*R(SOC);$$

and wherein the OCV and R indicates the open-circuit voltage and a value of the impedance of the simulation high-voltage battery pack respectively, SOC indicates the state of charge of the simulation high-voltage battery pack, OCV and R both are in a function relationship with the SOC, I(t) indicates the charging current, and t is a time variable.

2. The high-voltage battery charging simulation system as claimed in claim 1, wherein the DC load machine is configured to simulate the current voltage of the simulation high-voltage battery pack and the power supplier is configured to simulate the open-circuit voltage of the simulation high-voltage battery pack.

3. The high-voltage battery charging simulation system as claimed in claim 1, the charging station is supported by the DC fast-charging standards of CHAdeMO, Society of Automotive Engineers (SAE), International Electrotechnical Commission (IEC), or Guo Biao (GB) of China's National Standards.

4. The high-voltage battery charging simulation system as claimed in claim 1, wherein the simulation battery management system is an industrial or embedded apparatus with controlling and displaying functions.

5. The high-voltage battery charging simulation system as claimed in claim 1, wherein the simulation high-voltage battery pack is in a charging state when the current voltage is less than the charging voltage and larger than or equal to the open-circuit voltage.

6. The high-voltage battery charging simulation system as claimed in claim 1, wherein the simulation high-voltage battery pack is in a fully charged state when the current voltage and the open-circuit voltage are equal to the charging voltage.

7. An operating method of a high-voltage battery charging simulation system, the method comprising:
   configuring initial values of a current voltage and an open-circuit voltage by a simulation battery management system;
   transmitting the current voltage and an detected charging current to a multi-party communication device by the simulation battery management system;
   determining a charging voltage and a charging current according to the received current voltage and the detected charging current;
   translating the charging voltage and the charging current to a language adopted by a charging station and transmitting the translated charging voltage and the translated charging current to the charging station by the multi-party communication device;
   transferring to a charging state upon confirming the charging voltage and the charging current are correct;
   calculating and updating the current voltage and the open-circuit voltage by the simulation battery management system during the charging state, and transmitting the current voltage and the detected charging current to the multi-party communication device; and
   transferring to a fully charged state when the current voltage and the open-circuit voltage are equal to the charging voltage;
   wherein the current voltage is calculated by the equation:

$$\text{current voltage}=OCV(SOC)+I(t)*R(SOC);$$

and wherein the OCV and R indicates the open-circuit voltage and a value of the impedance of the simulation high-voltage battery pack respectively, SOC indicates the state of charge of the simulation high-voltage battery pack, OCV and R both are in a function relationship with the SOC, I(t) indicates the charging current, and t is a time variable.

8. The operating method as claimed in claim 7, wherein the simulation high-voltage battery pack is in a charging state when the current voltage is less than the charging voltage and larger than or equal to the open-circuit voltage.

9. The operating method as claimed in claim 7, wherein the simulation high-voltage battery pack is in a fully charged state when the current voltage and the open-circuit voltage are equal to the charging voltage.

10. The operating method as claimed in claim 7, wherein the simulation battery management system is an industrial or embedded apparatus with controlling and displaying functions.

11. The operating method as claimed in claim 7, wherein the DC load machine simulates the current voltage of the simulation high-voltage battery pack, the power supplier simulates the open-circuit voltage of the simulation high-voltage battery pack.

12. The operating method as claimed in claim 7, wherein the charging station is supported by the DC fast-charging standards of CHAdeMO, Society of Automotive Engineers (SAE), International Electrotechnical Commission (IEC), or Guo Biao (GB) of China's National Standards.

* * * * *